US005471175A

United States Patent [19]
Chiu et al.

[11] Patent Number: 5,471,175
[45] Date of Patent: Nov. 28, 1995

[54] INPUT PROTECTION CIRCUIT FOR A CMOS COMPARATOR

[75] Inventors: Kwok-Fu Chiu; Don R. Sauer, both of San Jose, Calif.

[73] Assignee: National Semiconductor Corporation, Santa Clara, Calif.

[21] Appl. No.: 296,056

[22] Filed: Aug. 24, 1994

[51] Int. Cl.$^6$ .................................................. H03F 3/04
[52] U.S. Cl. ............................ 330/298; 330/51; 330/252; 330/253
[58] Field of Search ............................ 327/65, 66, 67, 327/545; 330/51, 207 P, 252, 295, 298, 253

[56] References Cited

U.S. PATENT DOCUMENTS

| | | | |
|---|---|---|---|
| 4,236,120 | 11/1980 | White | 330/297 X |
| 4,636,744 | 1/1987 | King et al. | 330/295 |
| 5,101,170 | 3/1992 | Torazzina et al. | 330/51 |
| 5,153,529 | 10/1992 | Koda et al. | 330/295 |
| 5,193,821 | 3/1993 | Brambilla et al. | 330/51 |

OTHER PUBLICATIONS

Article entitled "Channel Length and Width Effects on NMOS Transistor Degradation Under Constant Positive Gate-Voltage Stressing" by Ken Wu, Sam Pan, David Chin, and J. Shaw, Intel Corporation, IDEM 91, IEEE 1991, pp. 735–738.

Primary Examiner—James B. Mullins
Attorney, Agent, or Firm—Skjerven, Morrill, MacPherson, Franklin & Friel; Edward C. Kwok

[57] ABSTRACT

An improved input protection circuit receiving a differential signal has a small signal input circuit and a large signal input circuit. The small signal input circuit is active when the differential input signal has a magnitude not exceeding a predetermined value. The large signal input circuit is active when the differential input signal has a magnitude exceeding the predetermined value. Because the small signal input circuit does not see a large differential signal across the gate terminals of its input transistors, offset voltage ("$V_{os}$") drift is avoided resulting in enhanced circuit reliability. A switch circuit isolates the small signal input circuit when the large signal input circuit is active.

7 Claims, 13 Drawing Sheets

INPUT PROTECTION CIRCUIT FOR A CMOS COMPARATOR

BACKGROUND OF THE INVENTION

1. Field of the Invention

The present invention relates to the design of electronic circuits, and in particular, relates to the design of CMOS integrated circuits.

2. Discussion of Related Art

An MOS transistor operating under the stress of a high gate voltage experiences a drift of the threshold voltage ($V_T$) over time. Such threshold voltage drift has been extensively studied. For example, the article "Channel Length and Width Effects on NMOS Transistor Degradation under Constant Positive Gate-Voltage Stressing", by K. Wu et al, published in *Proceedings of the IEDM* (1991), IEEE, pp. 735–38, discusses the geometric effect of such transistor degradation.

In a CMOS comparator, very often a large differential voltage is applied across the comparator's terminal, so that one of two input transistors is in the "on" state, while the other input transistor is in the "off" state. Such a large differential signal may result in a differential stress at the gate terminals of the input transistors, leading to different drifts in the threshold voltages of the input transistors over a long period of time. A measure of the sensitivity of a CMOS comparator is the offset voltage ($V_{OS}$), which is the smallest differential voltage received by the comparator necessary to drive the output of the comparator to one of its two output states. Over a long period of time, the different drifts in threshold voltages of the input transistors dominate the drift in $V_{OS}$ voltage, resulting in serious reliability problems in such a CMOS comparator.

SUMMARY OF THE INVENTION

In accordance with the present invention, a comparator circuit is provided including: (a) an input protection circuit, which receives an input differential signal and which includes both a small signal input circuit and a large signal input circuit; (b) an input stage circuit for providing the comparator's output signal indicating whether the differential input signal received is positive or negative; and (c) a bias circuit for providing a bias voltage used in the input protection circuit and the input stage circuit. In one embodiment, the comparator circuit further includes an output stage circuit for amplification of the comparator output signal.

In accordance with another aspect of the present invention, the input protection circuit includes: (a) a large signal input circuit which, in response to a differential input signal, provides a differential output signal, when the magnitude of the differential input signal exceeds a predetermined value; (b) a small signal input circuit which, in response to a differential input signal, provides a differential output signal, when the magnitude the differential input signal does not exceed the predetermined value; and (c) a switch circuit for isolating the small signal input circuit from the differential input signal when the magnitude of the differential input signal exceeds the predetermined value.

In one embodiment of the present invention, the small signal input circuit of the input protection circuit includes: (a) a current source; (b) first and second transistors, which have their source terminals coupled to the current source, the differential input signal coupled across their gate terminals and the differential output signal tapped across their drain terminals.

In one embodiment of the present invention, the large signal input circuit includes: (a) first and second output terminal from which a differential output signal is tapped; (b) a current source; (c) a first circuit coupled to receive a differential input signal, the first circuit being coupled to the current source and the first output terminal such that a current is provided in the first output terminal, when the differential input signal is positive and having a magnitude exceeding a predetermined value; and (d) a second circuit coupled to receive the differential input signal, the second circuit being coupled to the current source and the second output terminal, such that a current is provided in the second output terminal, when the differential input signal is negative and having a magnitude exceeding the predetermined value.

Because the large signal input circuit is not sensitive to offset voltage ("$V_{OS}$") drift reliability is enhanced because no large differential signal is coupled across the input terminals of the small signal input circuit.

The present invention is better understood upon consideration of the detailed description below and the accompanying drawings.

DETAILED DESCRIPTION OF THE PREFERRED EMBODIMENTS

Figure 1:
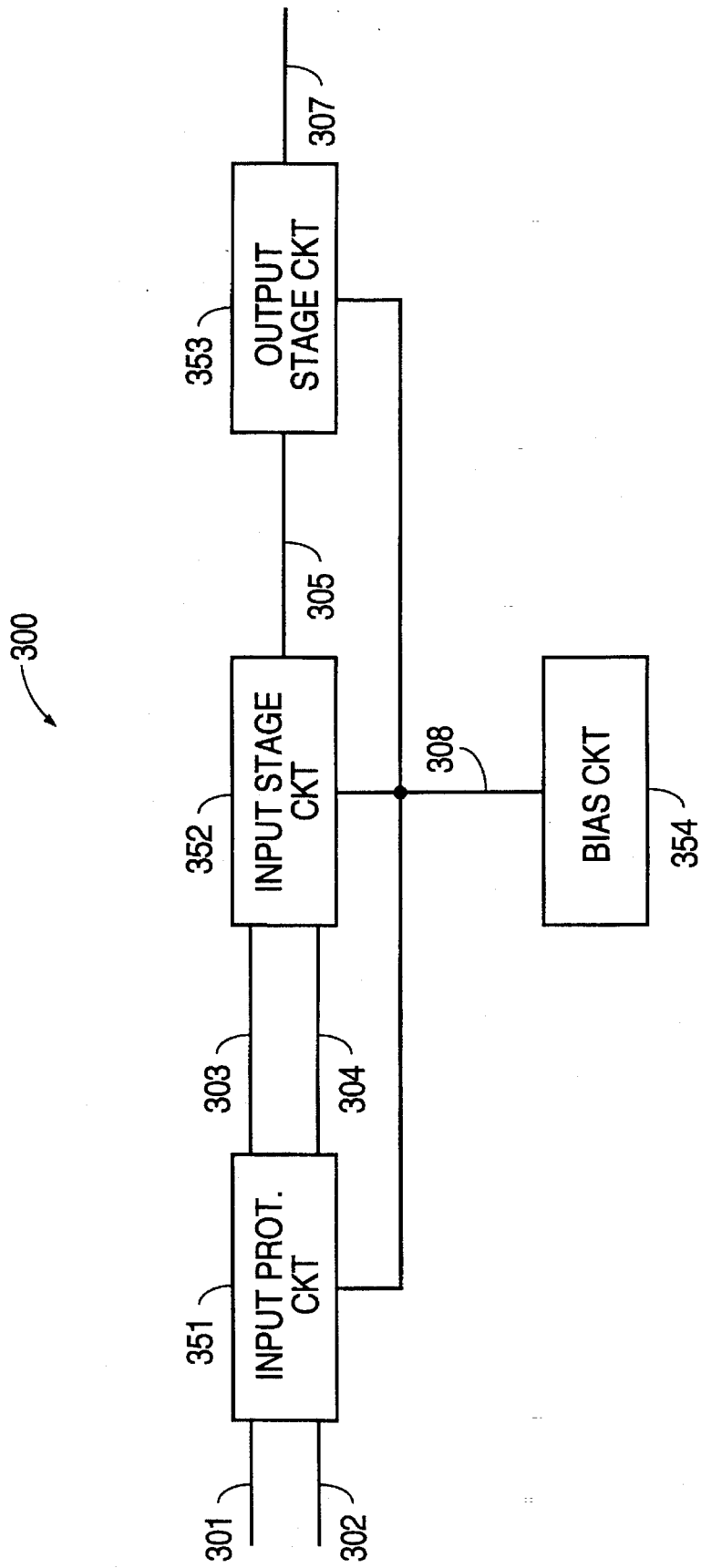
FIG. 1 shows a comparator 300, in accordance with one embodiment of the present invention.
Figure 3A:
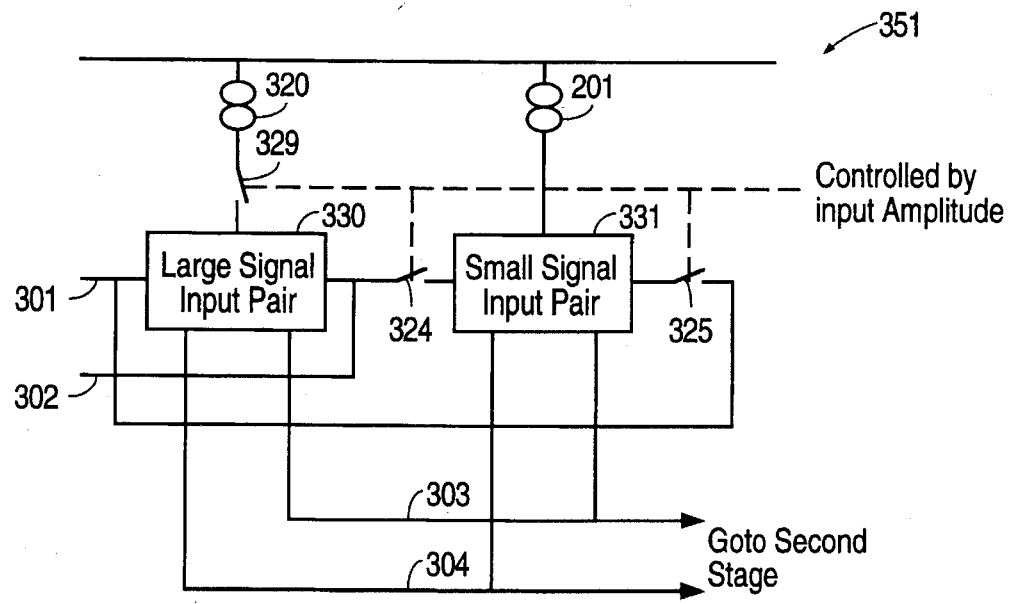
FIG. 3a is a block diagram of input protection circuit 351 of the present embodiment.
Figure 3B:
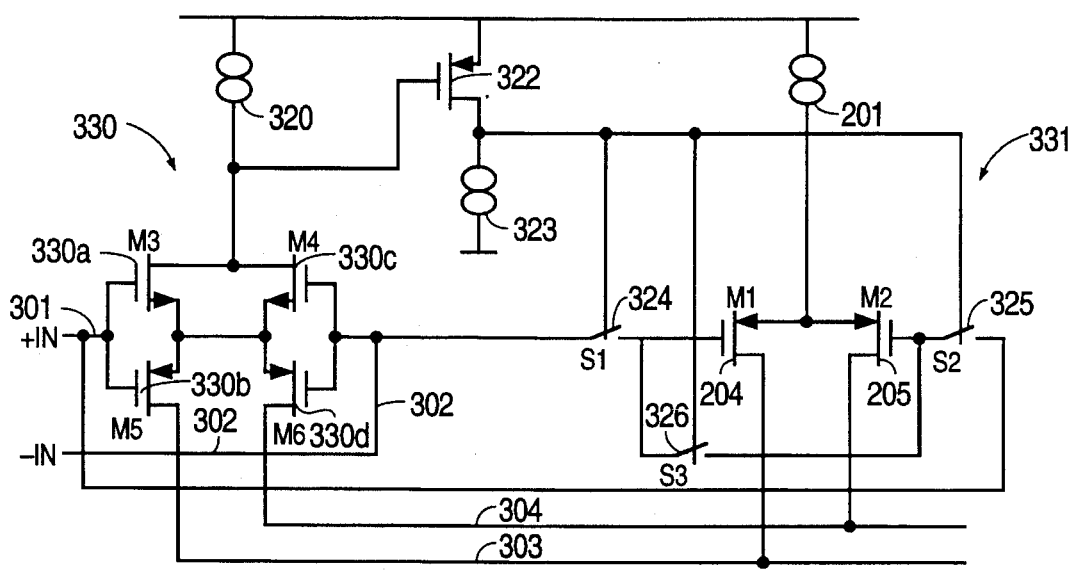
FIG. 3b is a schematic circuit of input protection circuit 351 of the present embodiment.
Figures 1, 3C:
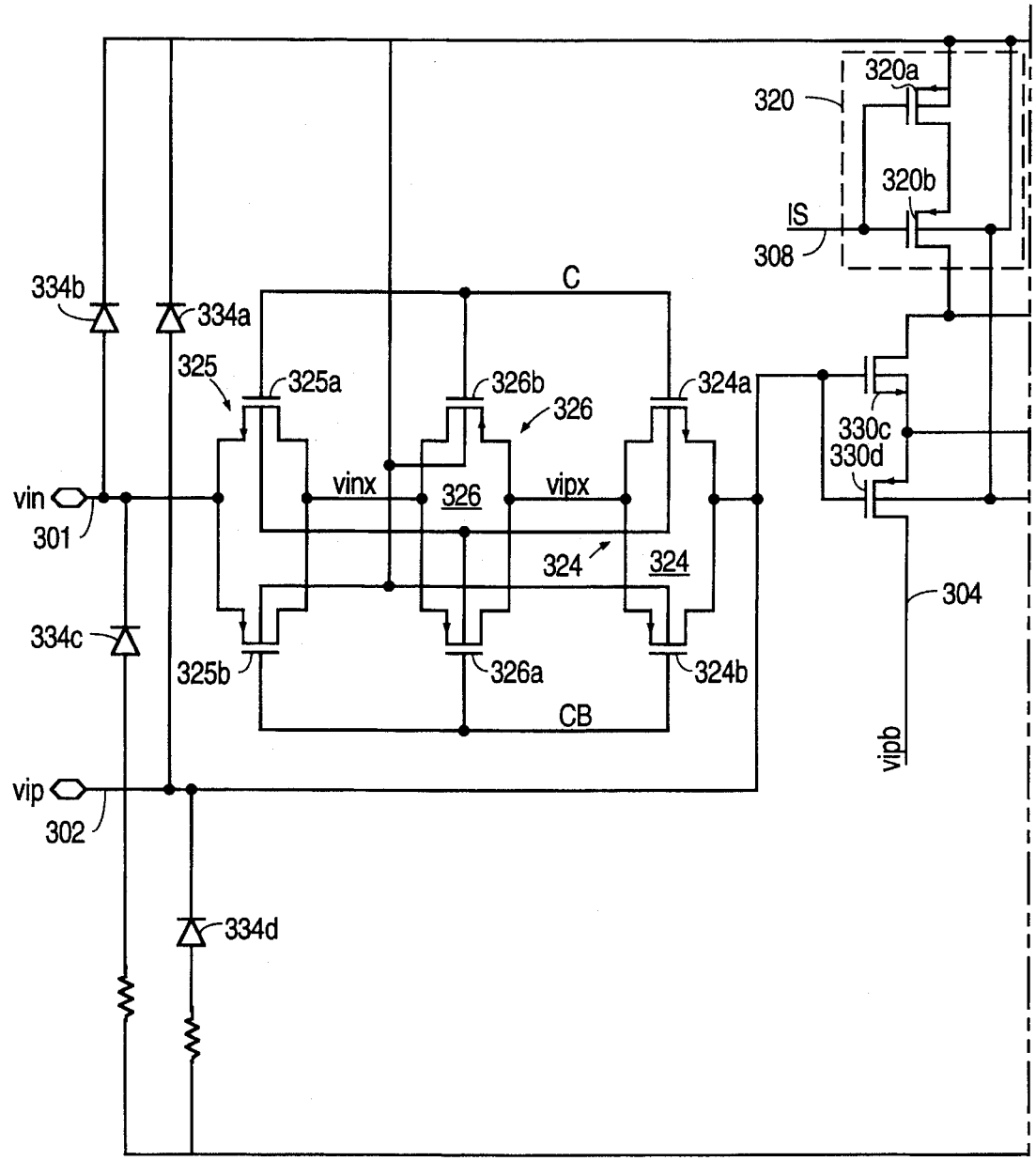
FIG. 3c is a transistor level schematic circuit showing in further detail input protection circuit 351 of the present embodiment.
Figures 2, 3C:
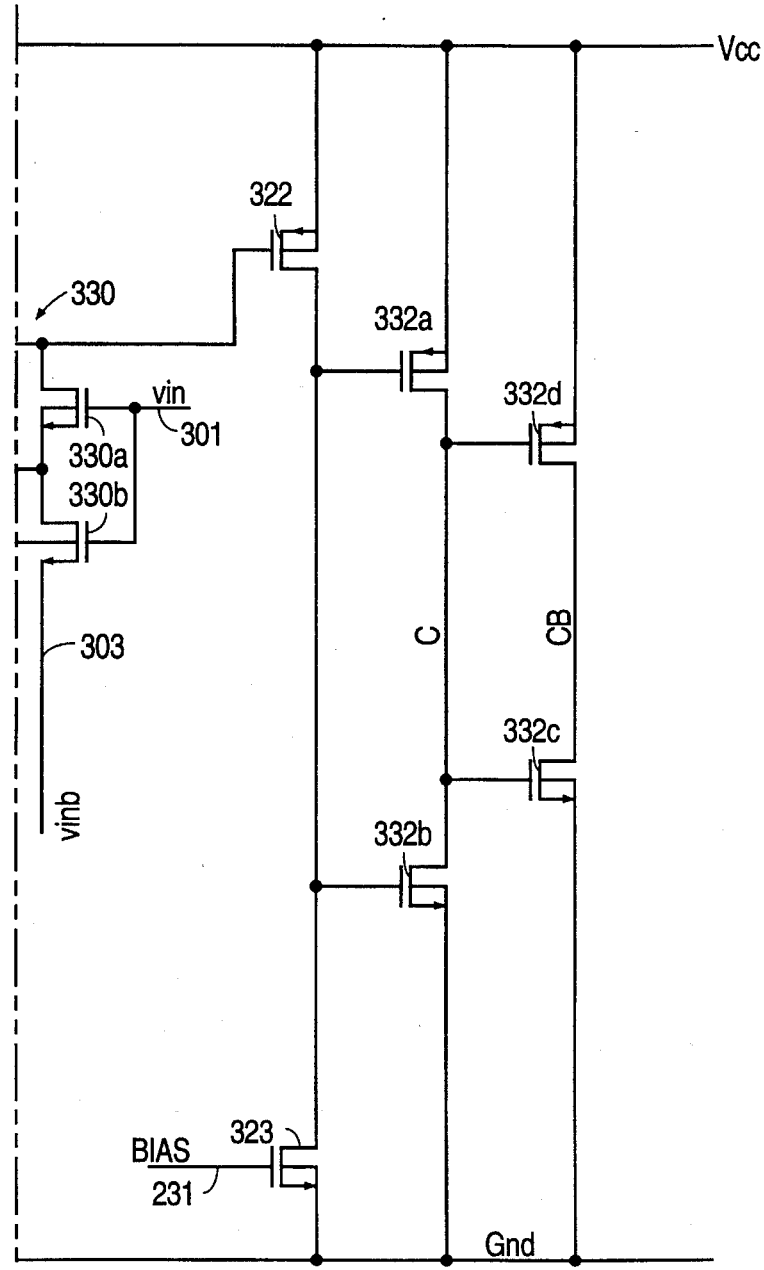

One embodiment of the present invention is provided in a comparator circuit 300 shown in FIG. 1. FIG. 1 is a block diagram of comparator circuit 300, which can be implemented as a CMOS integrated circuit. As shown in FIG. 1, comparator 300 includes input protection circuit 351, input stage circuit ("AB cascode amplifier") 352, output stage circuit 353 and bias circuit 354. A differential signal is received into input protection circuit 351 across terminals 301 and 302. Input protection circuit is designed to prevent large differential voltage to be applied across the gate terminals of the input transistors of a comparator, thereby preventing a drift in $V_{OS}$ (offset) voltage over time due to a differential drift in threshold voltages in these input transistors. FIGS. 3a, 3b and 3c are respectively a block diagram and a schematic circuit, and a transistor level schematic circuit for input protection circuit 351, which is described in further detail below. Input protection circuit 351 provides a differential output signal across terminals 303 and 304 substantially proportional to the differential input signal across terminals 301 and 302.

Figure 2A:
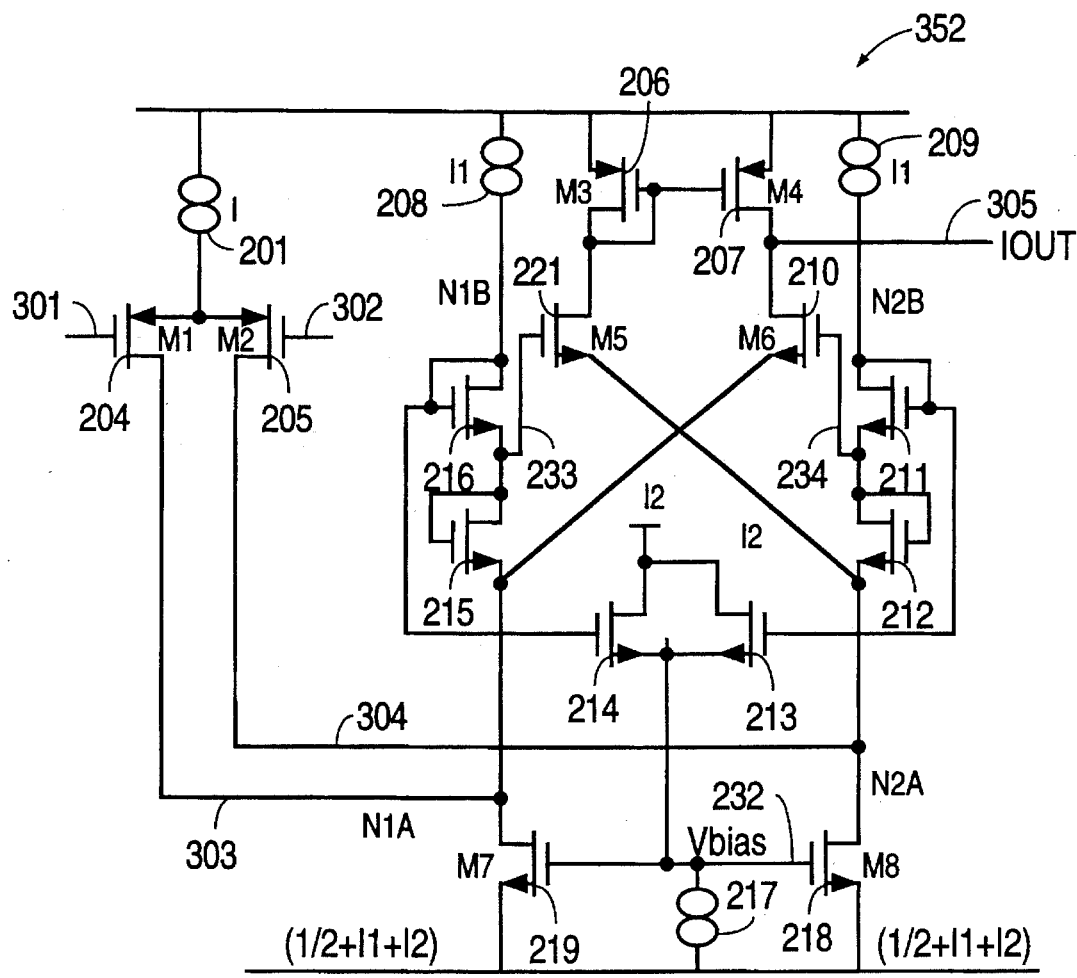
FIG. 2a is a schematic diagram of an AB cascode amplifier 352, in accordance with the present invention.
Figures 1, 2B:
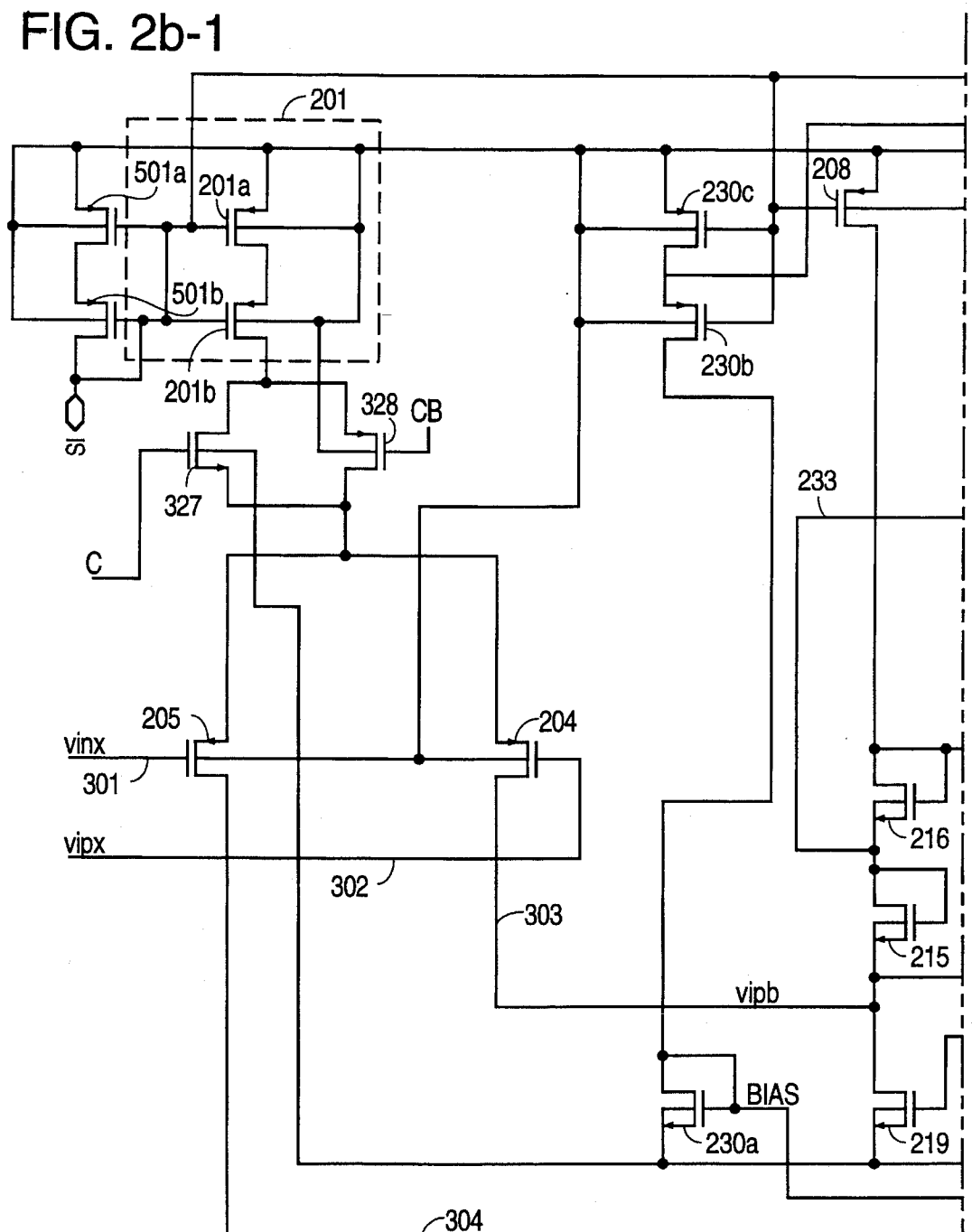
FIG. 2b is a transistor level schematic circuit showing in further detail the schematic diagram of AB cascode amplifier 352.
Figures 2, 2B:
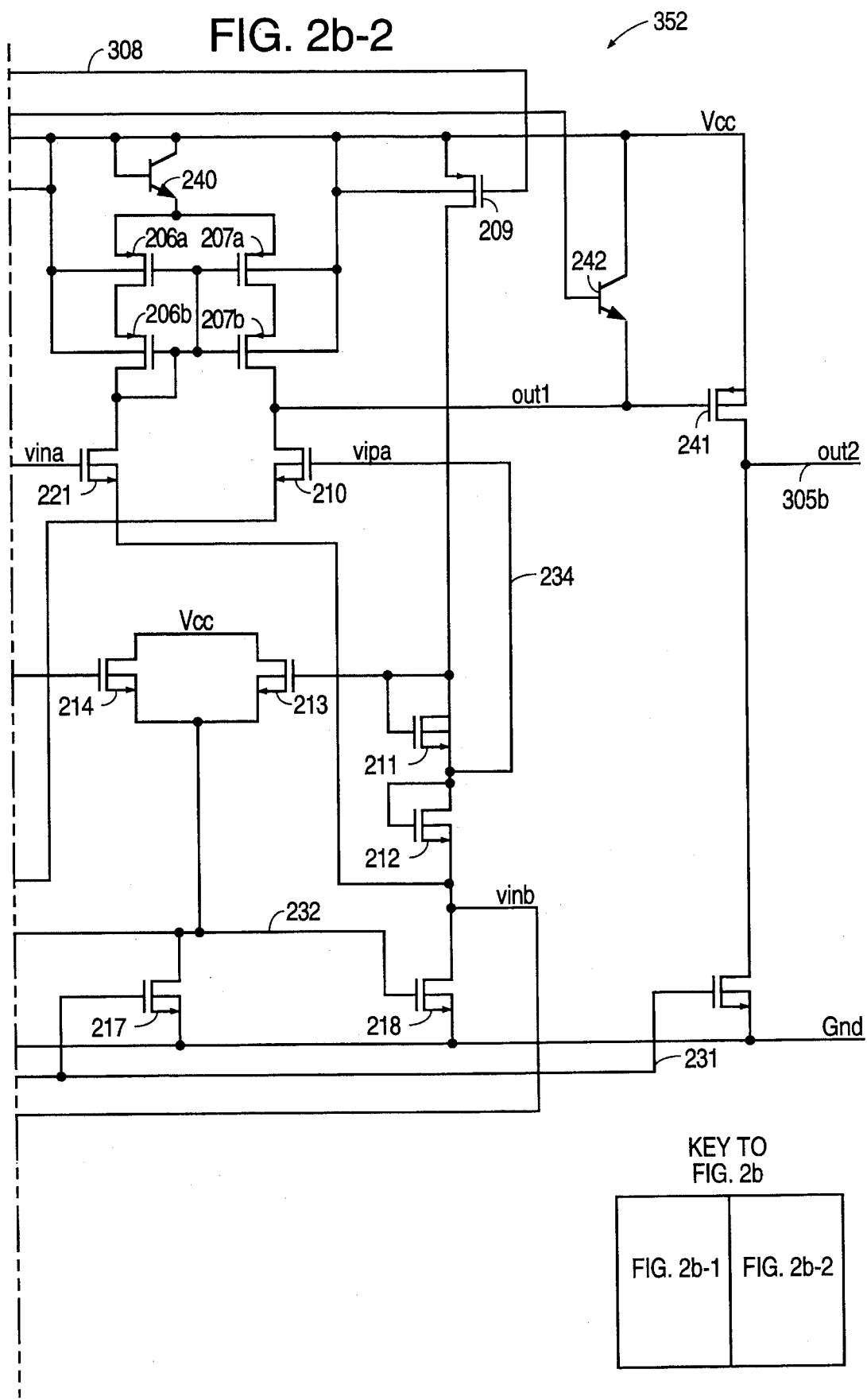

FIGS. 2a and 2b are, respectively, a schematic diagram and a transistor level schematic diagram of input stage circuit 352. Input stage circuit 352 is described in copending patent application entitled "AB Cascode Amplifier in an input stage of an Amplifier or Comparator," by Kwok-Fu Chiu et al, Ser. No. 08/296,057, filed on the same day as the present application, assigned to National Semiconductor Corp., also the assignee of the present invention. The detailed description of input stage circuit 352 and the accompanying drawings in the copending patent application, Ser. No. 08/296,057, are hereby incorporated by reference.

In response to the differential signal across terminals 303 and 304, input stage circuit 352 provides an output signal 305 which is indicative of whether the voltage at terminal 301 is higher than the voltage at terminal 302. The voltage $V_{OS}$ represents the minimum voltage by which the voltage at terminal 301 must exceed the voltage at terminal 302 to drive the output signal at terminal 305 to "logic high".

Figure 4A:
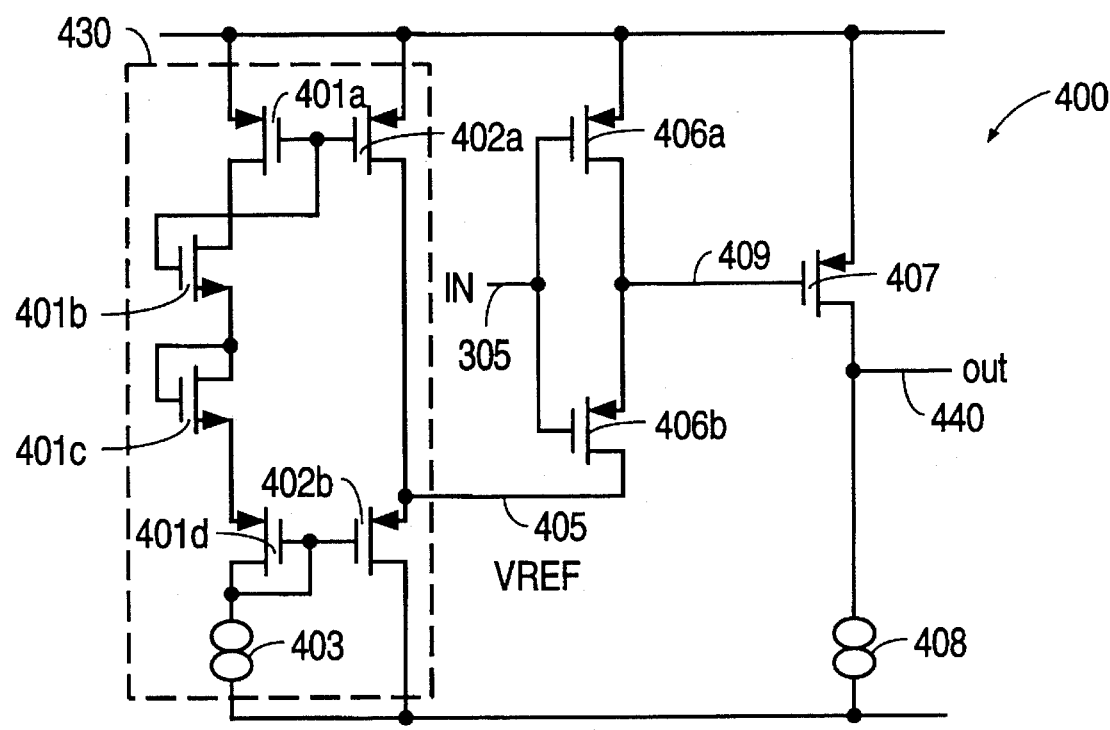
FIG. 4a is a schematic circuit of output stage circuit 353 of the present embodiment.
Figures 1, 4B:
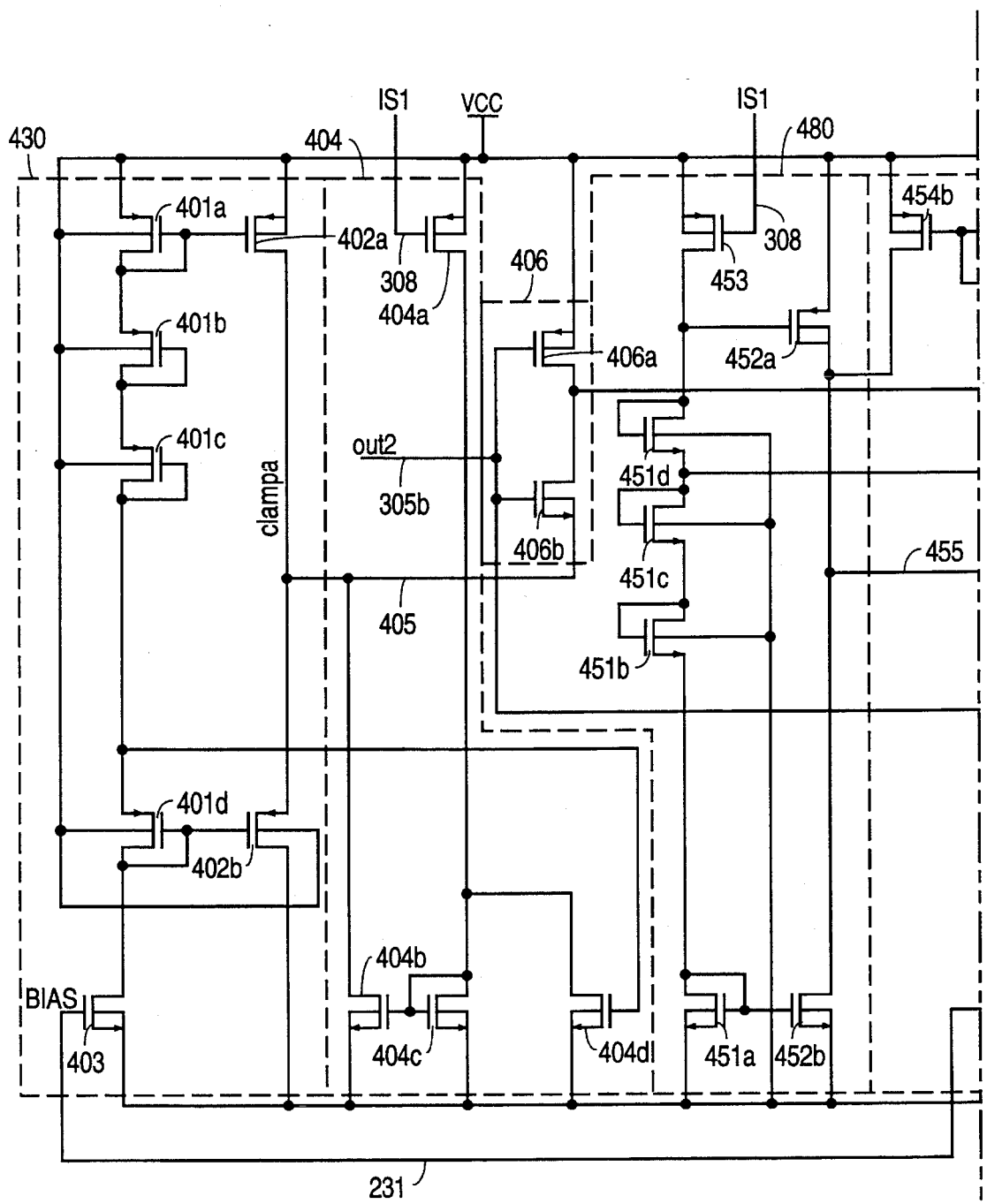
FIG. 4b is a transistor level schematic circuit showing in further detail output stage circuit 353 of the present invention.
Figures 2, 4B:
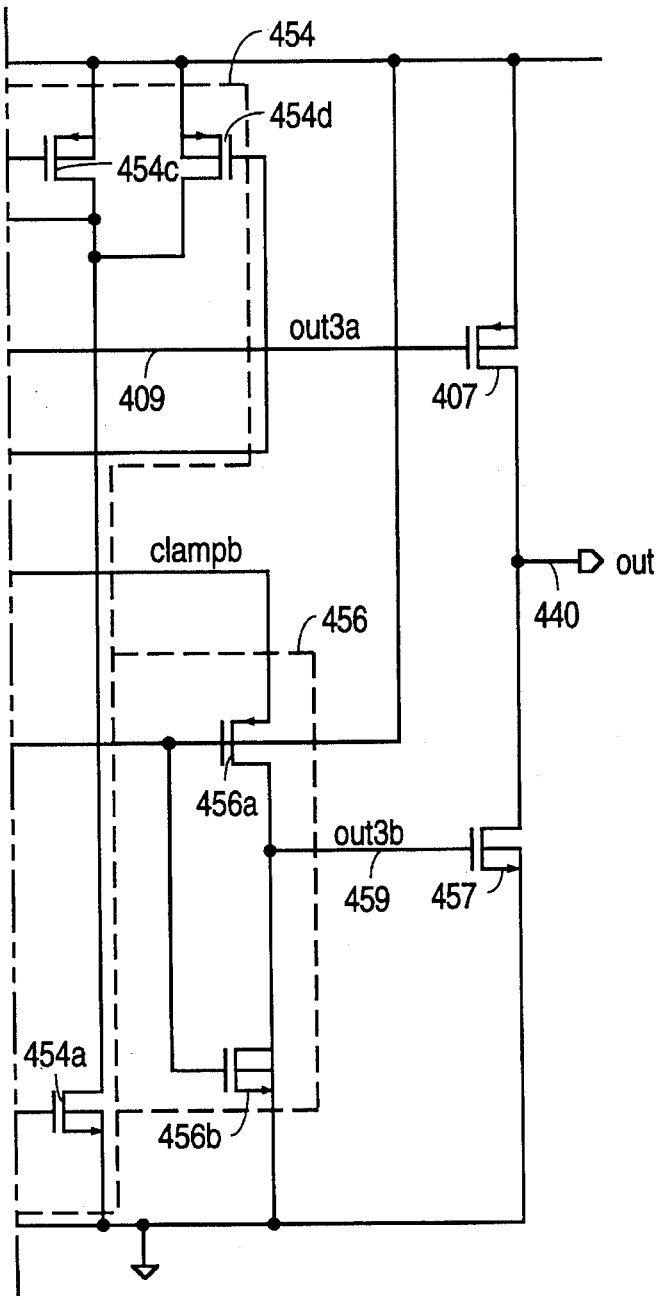

The output signal at terminal 305 is amplified by output stage circuit 353 as the output signal of comparator 300. This output signal of comparator 300 is provided at terminal 307. Output stage circuit 353 includes a structure adapted for short circuit protection. FIG. 4a and 4b are schematic circuits of output stage 353. Output stage 353 is described in further detail in copending patent application entitled "Output circuit with Short Circuit Protection in a CMOS Comparator," by Kwok-Fu Chiu et al, Ser. No. 08/295,135, filed on the same day as the present application, assigned to National Semiconductor Corp., also the assignee of the present invention. The detailed description of output stage 353 and the related drawings in copending patent application, are hereby incorporated by reference.

Figure 5A:
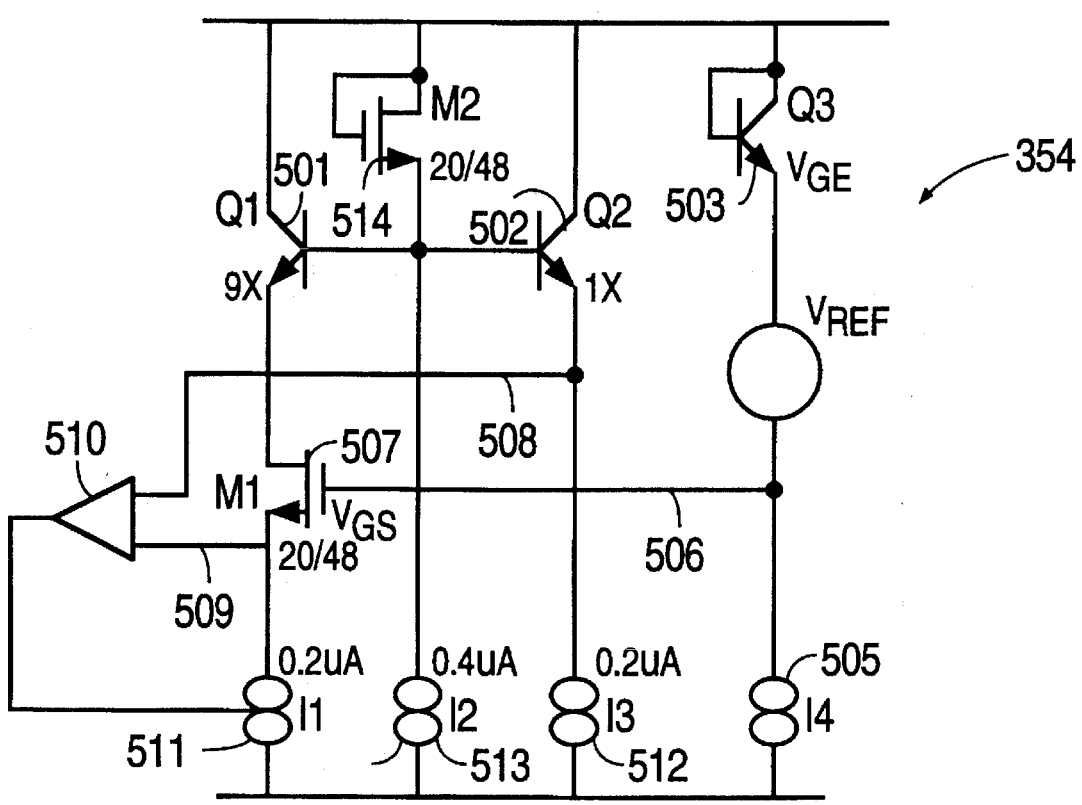
FIG. 5a is a schematic circuit of bias circuit 354 of the present embodiment.
Figures 1, 5B:
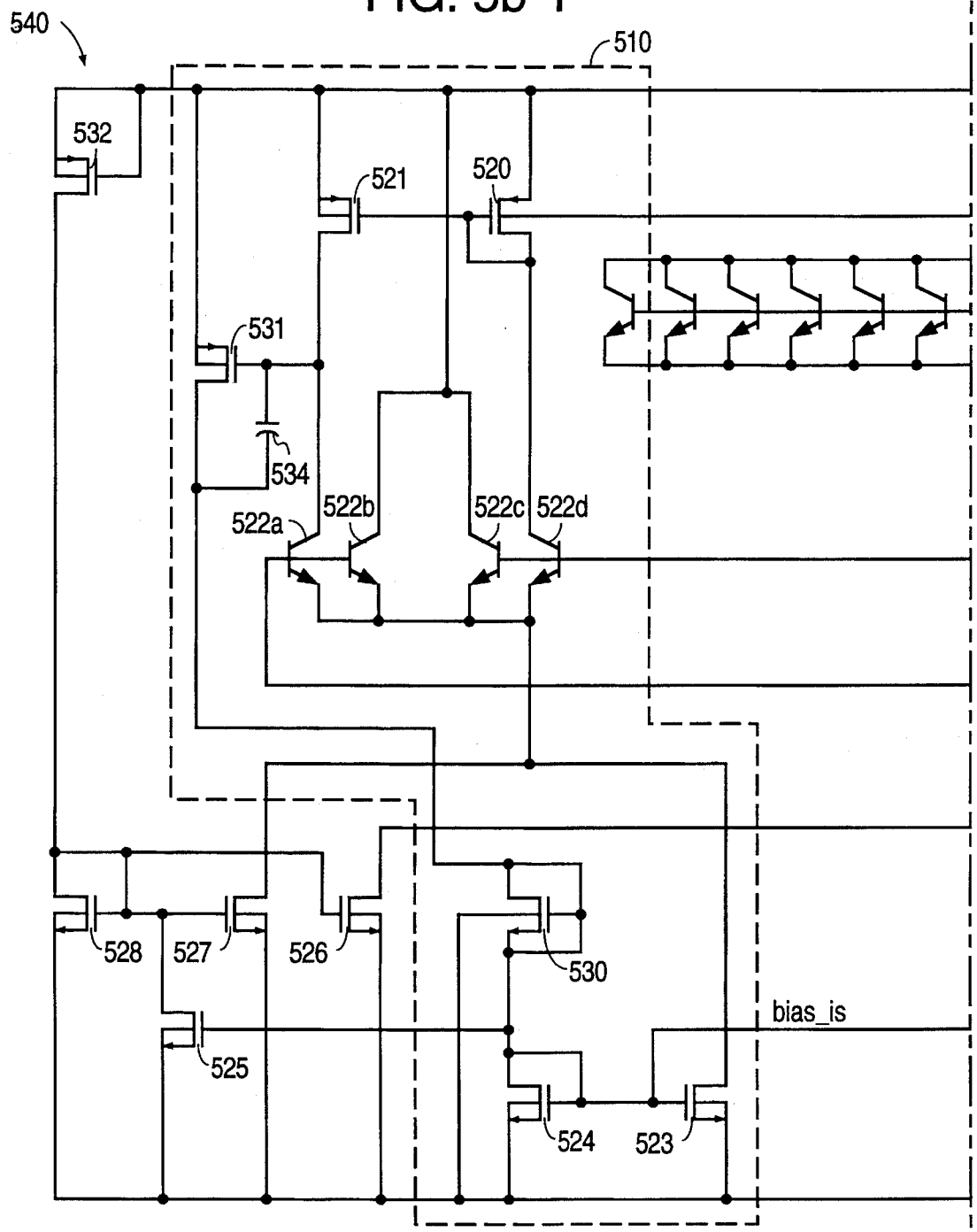
FIG. 5b is a transistor level schematic circuit showing in further detail bias circuit 354 of the present embodiment.
Figure 5B:
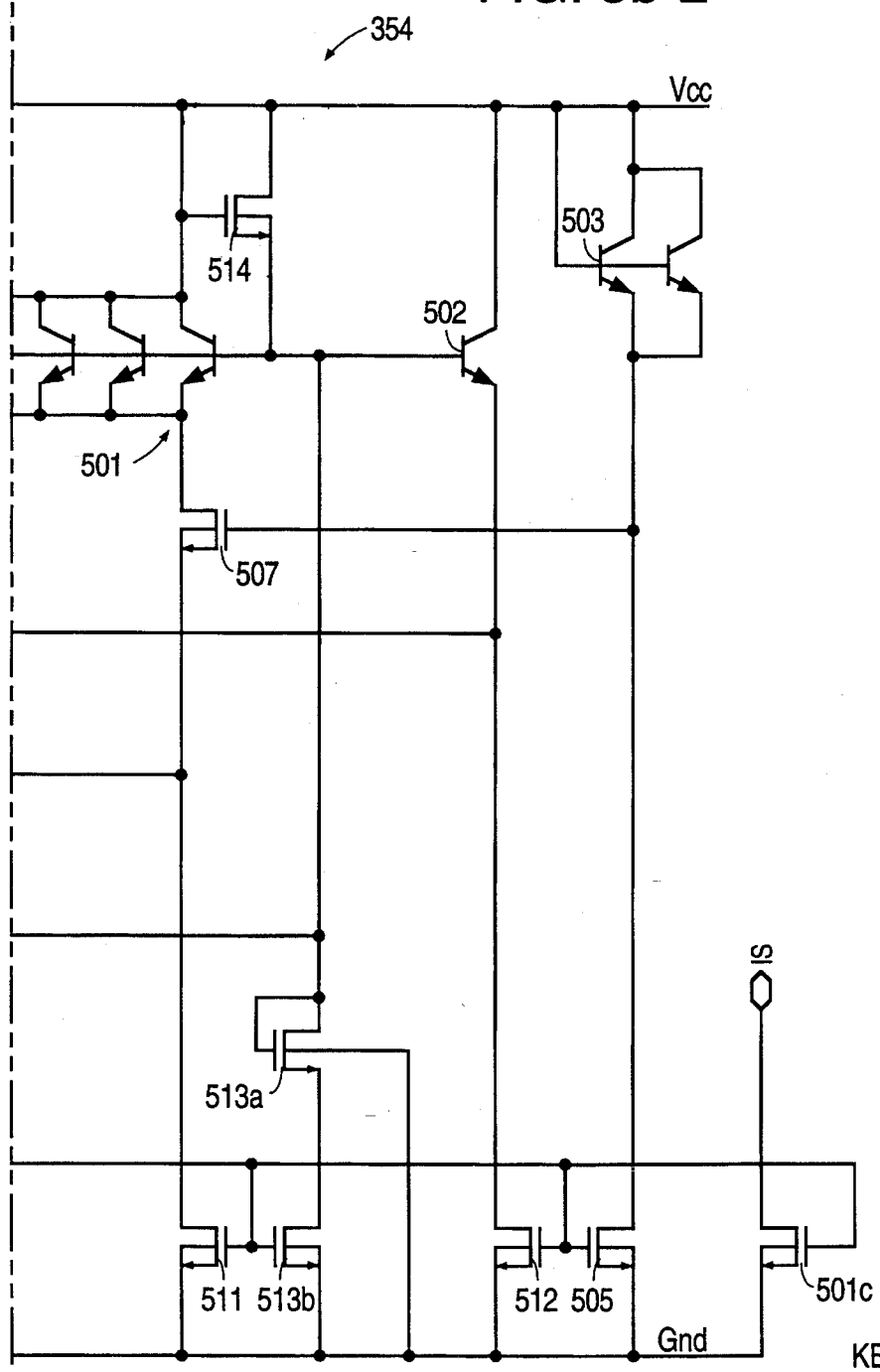
Figure 2:
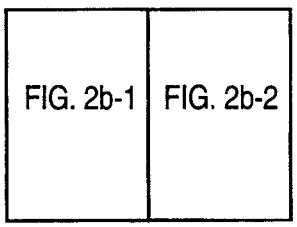

Input protection circuit 351, input stage circuit 352 and output stage circuit 353 all receive a bias voltage at terminal 308 from bias circuit 354. This bias voltage is designed to be process variation insensitive so as to ensure each implementation of comparator 300 provide the same reliable operation regardless of the variations in the manufacturing process. FIGS. 5a and 5b are schematic diagrams of bias circuit 354 of the present invention. Bias circuit 354 is described in copending patent application entitled "Circuit for Generating a Process Variation Insensitive Reference Bias Current," by Kwok-Fu Chiu, Ser. No. 08/295,331, filed on the same day as the present application, assigned to National Semiconductor Corp., also the assignee of the present invention. The detailed description of bias circuit 354 and the related drawings in copending patent application, are hereby incorporated by reference.

To avoid the reliability problem caused by $V_{OS}$ drift exposed over a prolong time period to high input voltages, the present invention provides in a comparator both a large signal input circuit and a small signal input circuit. The large signal input circuit handles input differential signals much larger than $V_{OS}$ and hence is insensitive to $V_{OS}$ input voltages. The small signal input circuit handles differential signals in the order of $V_{OS}$, but is prevented during operation from exposure to large differential input signals.

FIG. 3a is a block diagram of input protection circuit 351, in accordance with the present invention. As shown in FIG. 3a, a large signal input circuit 330 and a small signal input circuit 331 each receive a differential input signal across terminals 301 and 302. When the differential signal across terminals 301 and 302 is greater than a predetermined value, switches 326 and 329 are closed and switches 324 and 325 are open. Consequently, large signal input circuit 330 is activated, and small signal input circuit 331 is isolated from the differential signal across terminals 301 and 302. When large signal input circuit 330 is activated, as output of large signal input circuit 330, the current in current source 320 is split between the currents at terminals 303 and 304, in accordance with the relative magnitudes of the voltages at terminals 301 and 302.

Conversely, when the differential signal across terminals 301 and 302 does not reach the predetermined value, switches 326 and 329 are open and switches 324 and 325 are closed. Consequently, large signal input circuit 330 is deactivated, and small signal input circuit 331 is activated, i.e. receiving as input the differential signal across terminals 301 and 302. When small signal input circuit 330 is activated, the current in current source 201 is split between the currents at terminals 303 and 304, in accordance with the relative magnitudes of the voltages at terminals 301 and 302.

A schematic diagram of input protection circuit 351 of the present embodiment is shown in FIG. 3b. For greater detail, the transistor level schematic of input protection circuit 351 is shown in two figures. FIG. 2b shows a transistor level schematic circuit of small signal input circuit 331 and current source 201. FIG. 3c is a transistor level schematic circuit showing input protection circuit 351 excluding small input circuit 331 and current source 201.

In this embodiment shown in FIGS. 2b and 3c, small signal input circuit 331 includes transistors 204 and 205. As shown in FIG. 3b, differential input transistors 204 and 205 receive an input differential signal across terminals 301 and 302, when switches 324 and 325 are closed and switch 326 is open. Transistors 204 and 205 are shown in FIG. 2b. Switches 324–326 are shown in FIG. 3c as CMOS transmission gates formed by complementary transistor pairs 324a–324b, 325a–325b and 326a–326b respectively. Switches 324 and 325 are controlled by the voltage at the drain terminal of transistor 322, which is connected to current source 323. FIG. 3c shows that this voltage is buffered by two inverters to provide complementary signals C and CB. The two inverters are formed by transistors 332a, 332b, 332c and 332d. FIG. 3c also shows that the current source 323 is implemented by an NMOS transistor 323 which is biased by the voltage at terminal 231. The voltage at terminal 231 is generated by a bias circuit formed by transistors 230a, 230b and 230c, shown in FIG. 2b.

According to the relative voltages on the gate terminals 301 and 302 of input transistors 204 and 205, the current in current source 201 is split between transistors 204 and 205. As shown in FIG. 2b, current source 201 can be implemented by transistors 201a, 201b, 201c. Transistors 201a, 201b and 201c are biased by a bias voltage at terminal 308, which is generated by transistors 501a, 501b and 501c (transistor 501c is shown in FIG. 5b). Transistors 501a, 501b and 501 are part of bias circuit 354, which is described in detail in copending patent application, incorporated by reference above.

Current source 201 is designed to provide a current ("I") of approximately 1.44 microamps in this embodiment. Shown in FIG. 2b also are transistors 327 and 328 which form a switch controlled by signals C and CB, for turning off the currents in transistors 201a and 201b under the input protection scheme.

In this embodiment, as shown in FIG. 3b, large signal input circuit includes NMOS transistors 330a, 330c, and PMOS transistors 330b and 330d. The source terminals of transistors 330a–330d are connected together, and the drain terminals of transistors 330a and 303c are connected to current source 320. The drain terminals of transistors 330b and 330d provides the output currents at terminals 303 and 304 respectively. If the differential voltage across terminals 301 and 302 has a magnitude greater than the sum of the threshold voltages of transistors 330a and 330d, or the sum of the threshold voltages of transistors 330b and 330c, a current path is created between current source 320 and differential output terminals 303 and 304. If such differential signal is sufficiently positive (i.e the voltage at terminal 301 is greater than the voltage at terminal 302), a first current path exists through transistors 330a and 330d. Conversely, if the differential signal is sufficiently negative, a second current path exists through transistors 330b and 330c. When either current paths exists, the voltage at the gate terminal of transistors 322 decreases to turn on transistor 322. Consequently, the voltage on the drain terminal of transistor 322 decreases to open switches 324 and 325 (FIGS. 3b and 3c), and the switch formed by transistors 327 and 328 (FIG. 2b), resulting in isolating small signal input circuit 331. Current source 320, which supplies the current of either current path of large signal input circuit 330, is formed in this embodiment by PMOS transistors 320a and 320b. Transistors 320a and 320b are each biased by the voltage at terminal 308, which is generated in bias circuit 354 discussed in copending patent application NS-2375US. Diodes 334a–334d provide input protection for terminals 301 and 302.

The above detailed description is provided to illustrate the specific embodiments of the present invention and is not intended to be limiting. Numerous variations and modification within the scope of the present invention are possible. The present invention is defined by the following claims.

We claim:

1. A comparator circuit, comprising:
   an input protection circuit receiving a differential input signal and providing a differential output signal corresponding to said differential input signal, said input protection circuit including a small signal input circuit, a large signal input circuit, and a switch circuit, said switching circuit disabling said small signal input circuit when said differential input signal has a magnitude exceeding a predetermined value;
   an input stage circuit receiving said differential output signal, for providing a comparator output signal indicating whether said differential input signal is positive or negative; and
   a bias circuit for providing a bias voltage used in said input protection circuit and said input stage circuit.

2. A comparator circuit as in claim 1, further comprising an output stage circuit for amplification of said comparator output signal.

3. An input protection circuit receiving a differential input signal and providing a differential output signal corresponding to said differential input signal, comprising:
   a large signal input circuit, operating between a Supply voltage and ground voltage, and receiving said differential signal for providing said differential output signal, when the magnitude of said differential input signal exceeds a predetermined value;
   a small signal input circuit, operating between said supply voltage and said ground voltage, and receiving said differential signal for providing said differential output signal, when said magnitude does not exceed said predetermined value; and
   a switch circuit for isolating said small signal input circuit from said differential input signal when said magnitude exceeds said predetermined value.

4. An input protection circuit as in claim 3, wherein said small signal input circuit comprises:
   a current source having a first and a second terminal, said first terminal being couple to said supply voltage; and
   first and second transistors, each having a source terminal, a drain terminal and a gate terminal, said source terminals of said first and second transistors being coupled to said current source, wherein said differential input signal is coupled across said gate terminals of said first and second transistors, and said differential output signal is provided across said drain terminals of said first and second transistors.

5. An input protection circuit as in claim 3, wherein said large signal input circuit comprises:
   a first output terminal;
   a second output terminal, wherein differential output signal is provided across said first and second output terminals;
   a current source having first and second terminals, said first terminal of said current source being coupled to said supply voltage; and
   a first circuit coupled to receive said differential input signal, said first circuit being coupled to said second terminal of said current source and said first output terminal, said first circuit being configured to provide a current in said first output terminal, when said differential input signal is positive and having a magnitude exceeding said predetermined value; and
   a second circuit coupled to receive said differential input signal, said second circuit being coupled to said second terminal of said current source and said second output terminal, said second circuit being configured to provide a current in said second output terminal, when said differential input signal is negative and having a magnitude exceeding said predetermined value.

6. An input protection circuit receiving a differential input signal and providing a differential output signal corresponding to said differential input signal, comprising:
   a large signal input circuit receiving said differential signal for providing said differential output signal, when the magnitude of said differential input signal exceeds a predetermined value;
   a small signal input circuit receiving said differential signal for providing said differential output signal, when said magnitude does not exceed said predetermined value; and
   a switch circuit for isolating said small signal input circuit from said differential input signal when said magnitude exceeds said predetermined value;
   wherein said large signal input circuit comprises:
   a first output terminal;
   a second output terminal, wherein differential output signal is provided across said first and second output terminals;
   a current source having first and second terminals, said first terminal of said current source being coupled to a supply voltage; and
   a first circuit coupled to receive said differential input signal, said first circuit being coupled to said second terminal of said current source and said first output terminal, said first circuit being configured to provide a current in said first output terminal, when said differential input signal is positive and having a magnitude exceeding said predetermined value; and a second circuit coupled to receive said differential input signal, said second circuit being coupled to said second terminal of said current source and said second output terminal, said second circuit being configured to provide a current in said second output terminal, when said differential input signal is negative and having a magnitude exceeding said predetermined value;

wherein said first and second circuits each comprise:
  a first transistor having a drain terminal coupled to said second terminal of said current source, a gate terminal, and a source terminal;
  a second transistor having a source terminal coupled to said source terminal of said first transistor, a gate terminal and a drain terminal coupled to one of said first and second output terminals; and
  wherein said differential input signal is coupled across said gate terminals of said first and second transistors.

7. An input protection circuit as in claim 6, wherein said switch circuit includes a control switch having a control terminal coupled to said second terminal of said current source.

* * * * *